(12) United States Patent
Zang et al.

(10) Patent No.: US 10,177,157 B2
(45) Date of Patent: Jan. 8, 2019

(54) TRANSISTOR STRUCTURE HAVING MULTIPLE N-TYPE AND/OR P-TYPE ELONGATED REGIONS INTERSECTING UNDER COMMON GATE

(71) Applicant: GLOBALFOUNDRIES INC., Grand Cayman (KY)

(72) Inventors: Hui Zang, Guilderland, NY (US); Min-hwa Chi, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/792,527

(22) Filed: Oct. 24, 2017

(65) Prior Publication Data

US 2018/0047734 A1 Feb. 15, 2018

Related U.S. Application Data

(62) Division of application No. 14/662,734, filed on Mar. 19, 2015, now Pat. No. 9,865,603.

(51) Int. Cl.
*H01L 27/11* (2006.01)
*H01L 21/82* (2006.01)
*H01L 27/092* (2006.01)
*H01L 21/8238* (2006.01)

(52) U.S. Cl.
CPC .. *H01L 27/1104* (2013.01); *H01L 21/823807* (2013.01); *H01L 21/823821* (2013.01); *H01L 21/823828* (2013.01); *H01L 27/092* (2013.01); *H01L 27/0924* (2013.01)

(58) Field of Classification Search
CPC ......... H01L 27/1104; H01L 21/823807; H01L 21/823821; H01L 21/823828; H01L 27/092; H01L 27/0924
USPC .......................................... 257/369; 438/199
See application file for complete search history.

(56) References Cited

U.S. PATENT DOCUMENTS

| | | | | |
|---|---|---|---|---|
| 3,840,888 | A * | 10/1974 | Gaensslen | H01L 27/092 148/DIG. 122 |
| 6,201,267 | B1 * | 3/2001 | Gupta | H01L 27/092 257/206 |
| 6,667,506 | B1 * | 12/2003 | Reedy | H01L 27/115 257/288 |
| 6,690,056 | B1 * | 2/2004 | Reedy | H01L 27/115 257/314 |
| 2004/0245579 | A1 * | 12/2004 | Ohmi | H01L 21/823807 257/376 |
| 2005/0153530 | A1 | 7/2005 | Ku et al. | |
| 2005/0224889 | A1 | 10/2005 | Oh et al. | |

(Continued)

OTHER PUBLICATIONS

Heiberg, et al., "Work Function of Boron-Doped Polycrystalline SlxGe1-x Films," IEEE Electron Device Letters, vol. 18, No. 9, Sep. 1997, pp. 456-458.

*Primary Examiner* — Didarul Mazumder
(74) *Attorney, Agent, or Firm* — Heslin Rothenberg Farley & Mesiti P.C.; Stephen Scuderi

(57) ABSTRACT

A semiconductor structure includes a semiconductor substrate, at least one first elongated region of n-type or p-type, and at least one other second elongated region of the other of n-type or p-type, the first and second elongated regions crossing such that the first elongated region and the second elongated region intersect at a common area, and a shared gate structure over each common area.

10 Claims, 7 Drawing Sheets

(56) References Cited

U.S. PATENT DOCUMENTS

| | | |
|---|---|---|
| 2006/0131653 A1* | 6/2006 | Kim .................. H01L 21/84 |
| | | 257/350 |
| 2006/0231901 A1 | 10/2006 | Chu |
| 2013/0001706 A1* | 1/2013 | Haran .................. H01L 21/84 |
| | | 257/410 |
| 2014/0027816 A1* | 1/2014 | Cea .................. H01L 29/66545 |
| | | 257/192 |
| 2014/0061793 A1 | 3/2014 | Pei et al. |
| 2014/0117483 A1 | 5/2014 | Jangjian et al. |
| 2015/0001643 A1* | 1/2015 | Kim .................. H01L 21/28229 |
| | | 257/410 |
| 2015/0041913 A1 | 2/2015 | An et al. |

\* cited by examiner

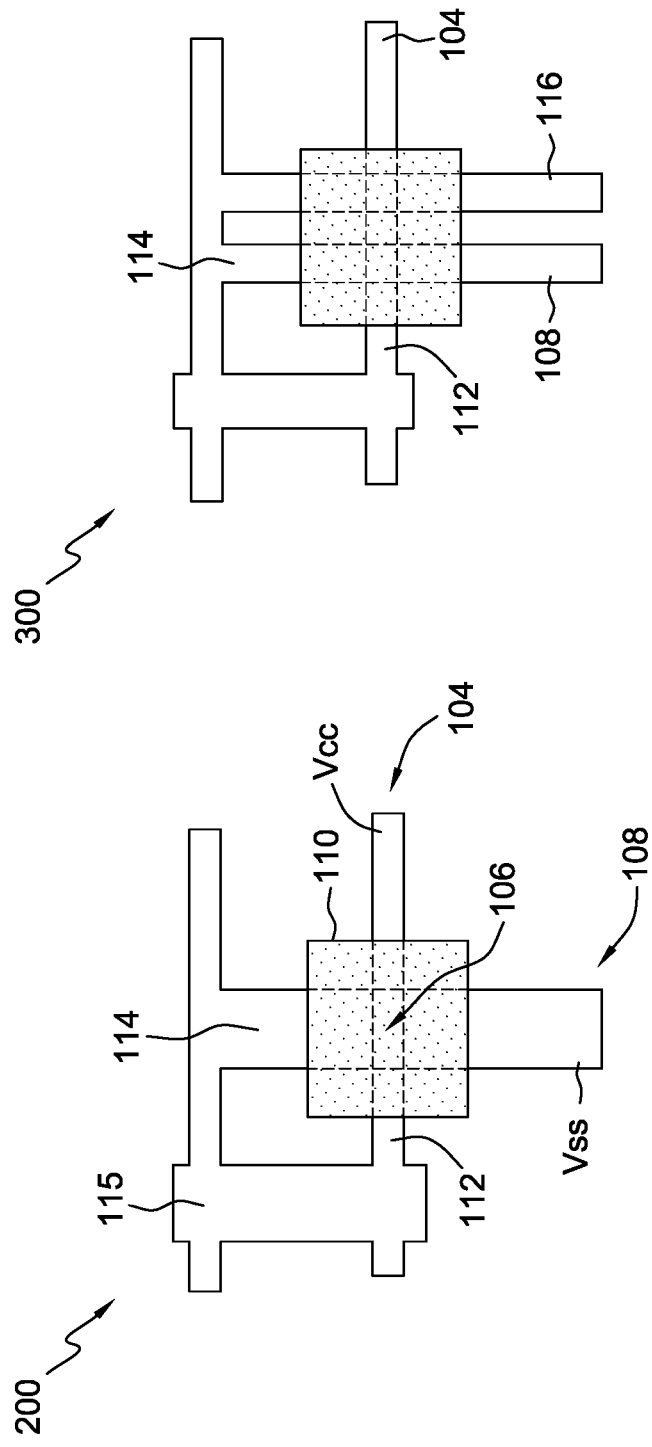

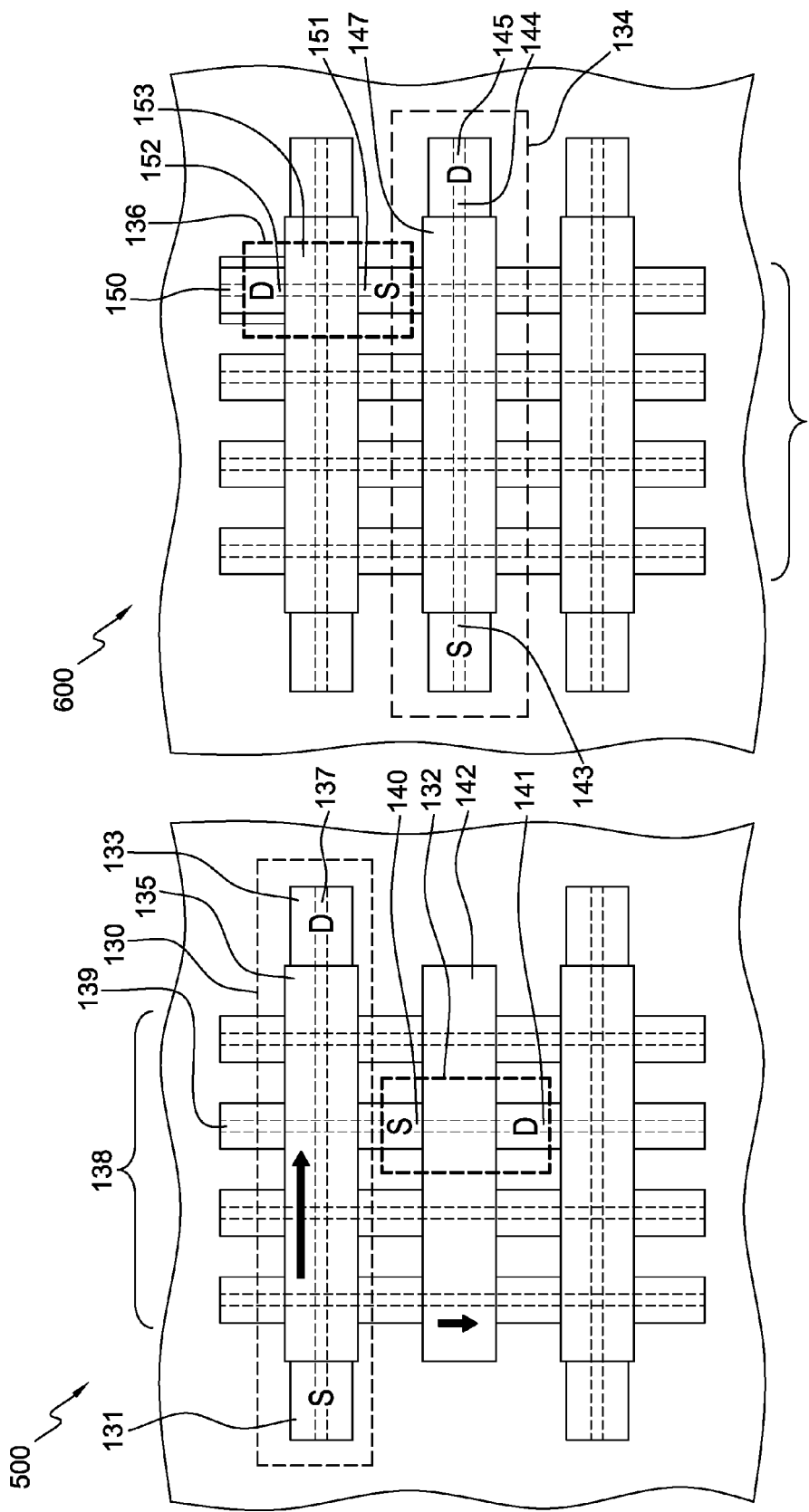

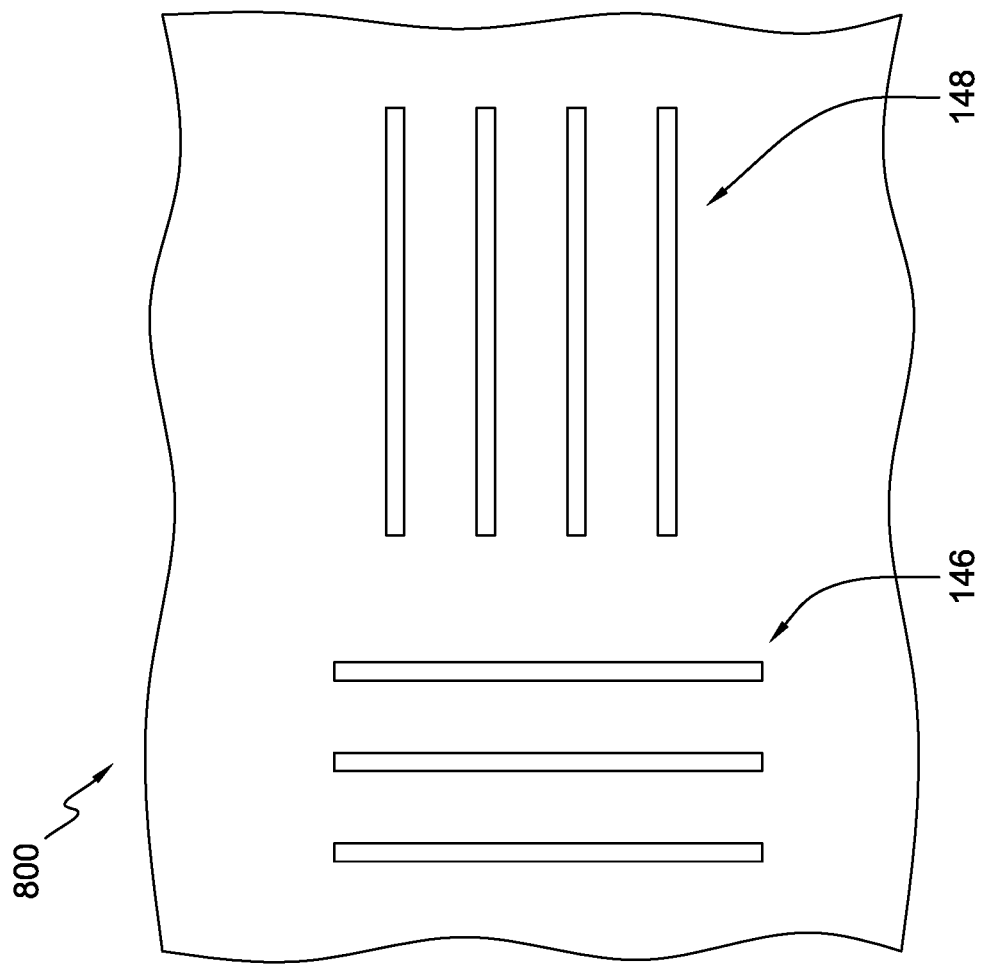

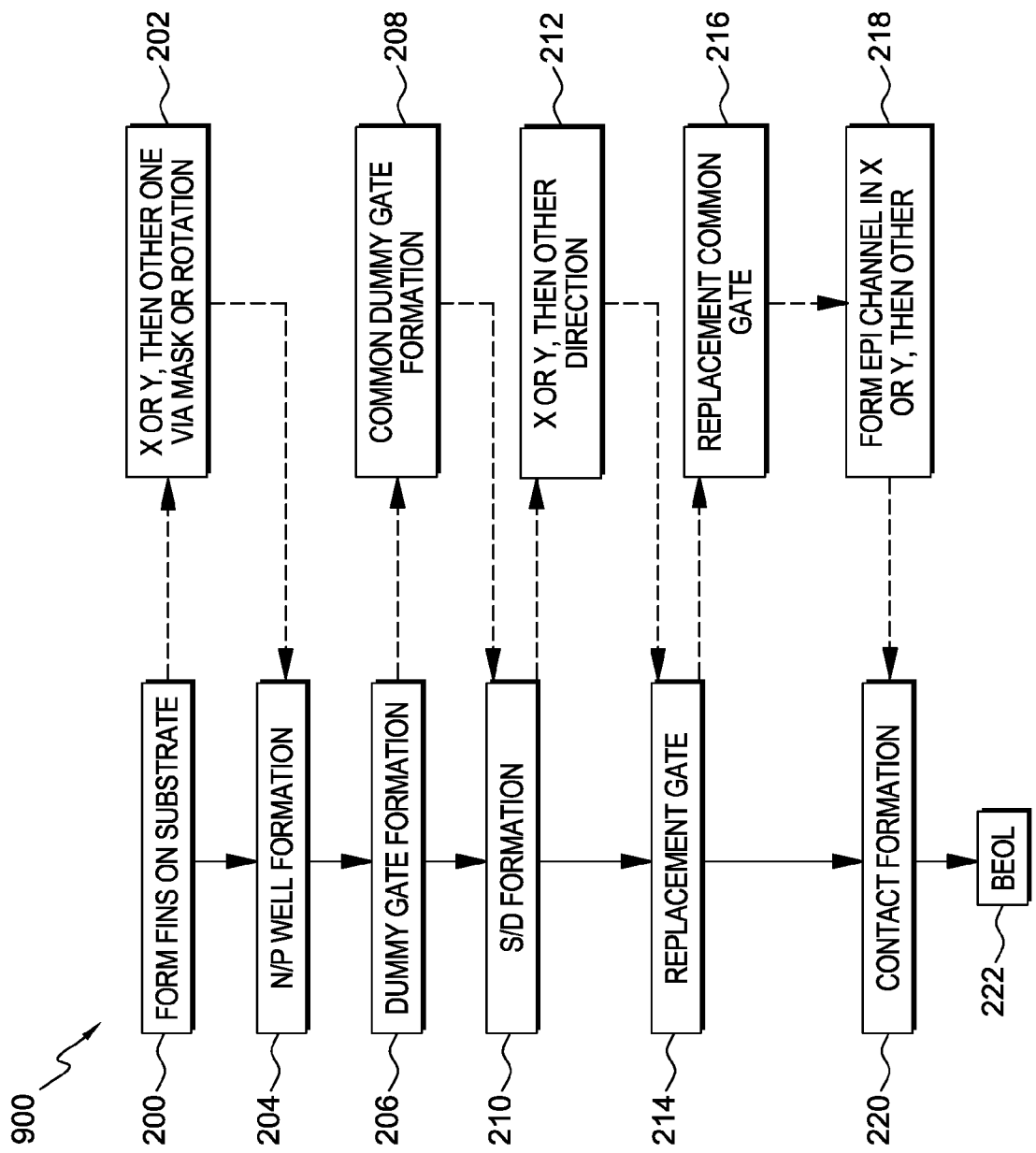

TRANSISTOR STRUCTURE HAVING MULTIPLE N-TYPE AND/OR P-TYPE ELONGATED REGIONS INTERSECTING UNDER COMMON GATE

CROSS-REFERENCE TO RELATED APPLICATIONS

This application is a divisional of U.S. patent application Ser. No. 14/662,734 filed Mar. 19, 2015, the entirety of which is hereby incorporated herein by reference.

BACKGROUND OF THE INVENTION

Technical Field

The present invention generally relates to semiconductor structures for low-power applications. More particularly, the present invention relates to merged n/p field effect transistor structures for low-power mobile applications.

Background Information

As device size continues to shrink, and mobile applications continue to increase, new device structures and fabrication processes beyond three-dimensional FinFETs are needed, particularly for low-power, high-performance mobile applications.

Thus, a need continues to exist for new device structures and fabrication processes to accommodate ever-shrinking device size.

SUMMARY OF THE INVENTION

The shortcomings of the prior art are overcome and additional advantages are provided through the provision, in one aspect, of a semiconductor structure. The structure includes a semiconductor substrate, at least one elongated region of one of p-type and n-type, at least one other elongated region of the other of p-type and n-type, a common area comprising an intersection of the at least one elongated region and the at least one other elongated region, and a shared gate structure over each common area.

In accordance with another aspect, a method is provided. The method includes providing a semiconductor substrate, creating at least one elongated region of n-type or p-type, and creating at least one other elongated region of the other of n-type or p-type, such that the at least one elongated region and the at least one other elongated region intersect at a common area.

These, and other objects, features and advantages of this invention will become apparent from the following detailed description of the various aspects of the invention taken in conjunction with the accompanying drawings.

BRIEF DESCRIPTION OF THE DRAWINGS

FIG. 3 is a top-down view of one example of an inverter created with the crossed fin and gate structure of FIG. 2, with two ends of the fins electrically coupled together, in accordance with one or more aspects of the present invention.

FIG. 4 is an alternate example of an inverter similar to that of FIG. 3, but with two crossed fins in the y-direction rather than one, in accordance with one or more aspects of the present invention.

FIG. 6 is a top-down view of one example of a non-planar semiconductor structure, including both long-channel and short-channel semiconductor devices based on the crossed-fin structure, in accordance with one or more aspects of the present invention.

FIG. 7 is a top-down view of another example of a non-planar semiconductor structure, including a p-type long-channel device based on the crossed-fin structure, and a short-channel device adjacent to the long-channel device, in accordance with one or more aspects of the present invention.

FIG. 9 is a top-down view of one example of a non-planar semiconductor structure with two non-planar semiconductor structures based on the crossed-fin structure, the structure oriented differently, in this case oriented about 90° different, in accordance with one or more aspects of the present invention.

FIG. 10 is a high-level flow diagram of the general process of FinFET fabrication and the additional steps to implement the crossed-fin structure, in accordance with one or more aspects of the present invention.

DETAILED DESCRIPTION OF THE INVENTION

Figure 2:
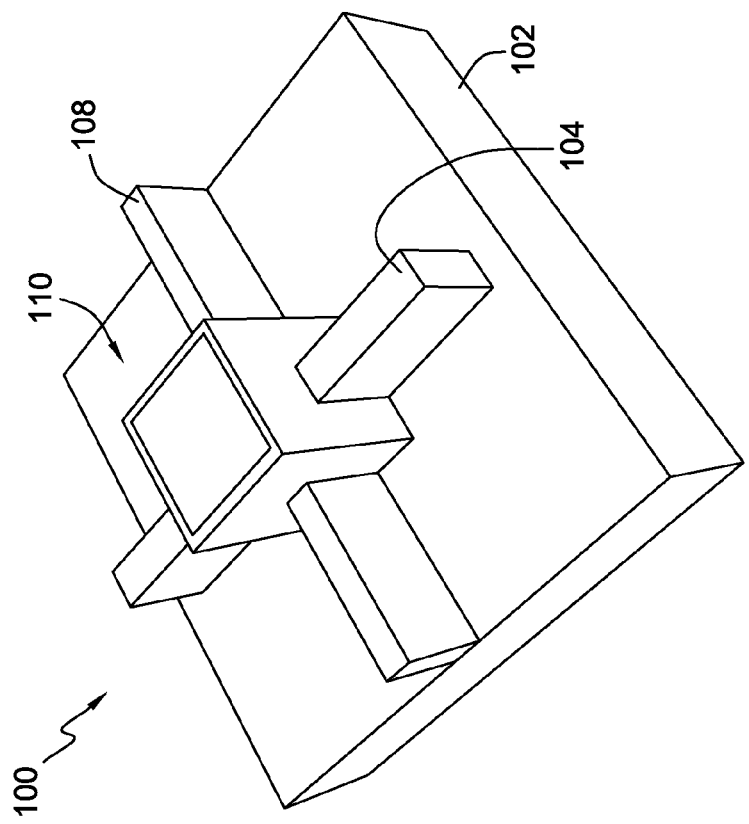
FIG. 2 depicts one example of the structure of FIG. 1 after creation of a common gate encompassing an intersection of the crossed fins, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

Figure 1:
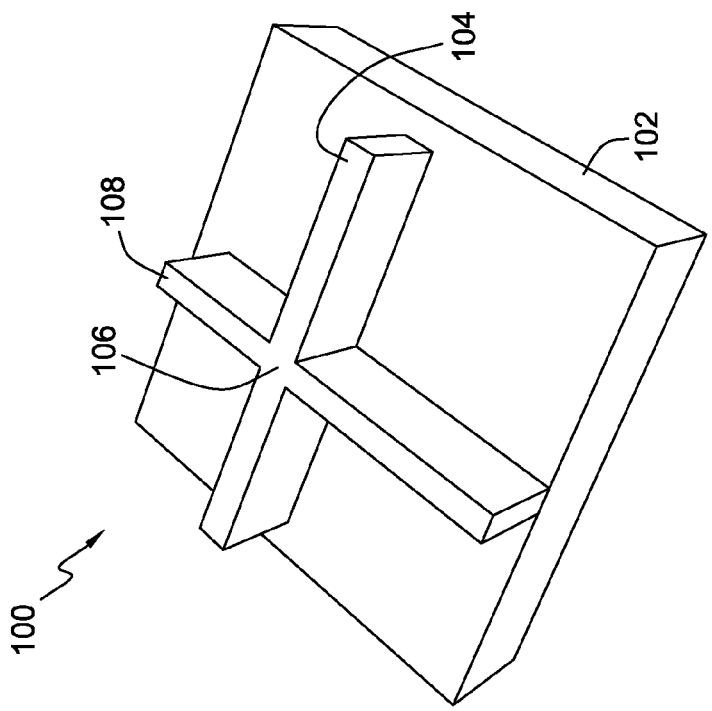
FIG. 1 is a three-dimensional perspective view of one example of a crossed-fin structure, in accordance with one or more aspects of the present invention.

FIG. 1 is a three-dimensional perspective view of one example of a crossed-fin (fins 104 and 108) structure 100 on a substrate 102, in accordance with one or more aspects of the present invention. More generally, the fins are examples of raised structures (raised with respect to the substrate).

The crossed-fin structure may be conventionally fabricated, for example, using known processes and techniques (e.g., conventional process of creating a fin; first in one direction and then the other). Although only a single cross-fin structure is shown for simplicity, it will be understood that, in practice, many such structures are typically included on the same bulk substrate. Further, although a three-dimensional structure is shown, the present invention is applicable in both planar and non-planar (or three-dimensional) semiconductor applications. Still further, the fins (more generally, the elongated regions) in a given common area may have the same or different widths.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The raised structure(s) (in this example, fins 104 and 108) may be etched from a bulk substrate, and may include, for example, any of the materials listed above with respect to the substrate. Further, some or all of the raised structure(s) may include added impurities (e.g., by doping), making them n-type or p-type.

FIG. 2 depicts one example of the structure 100 of FIG. 1 after creation of a common gate 110 encompassing an intersection (106, FIG. 1) of the crossed fins (104 and 108), in accordance with one or more aspects of the present invention.

In the present example, the common gate 110 may be either a dummy gate (i.e., when using a replacement gate process) or a conductive (or final) gate (i.e., using a "gate-first" fabrication process). Further, the common gate (or "gate stack") may be symmetrical or asymmetrical; in other words, the common gate may be misaligned at the intersection of the fins (more generally, the elongated regions of n-type or p-type). It was noted above that the fins may have added impurities. However, for fully depleted operation, the fins should have a lack of impurities in the common area (i.e., the channel) encompassing the intersection, as compared to the fins outside the common area, typically having a high concentration of impurities (serving as source and drain). In addition, it should be noted that the channel region under the common gate can include epitaxial semiconductor material, for example, epitaxial silicon germanium (e-SiGe) for a p-type merged transistor, or epitaxial silicon (e-Si) or epitaxial silicon carbide (e-SiC) for a n-type merged transistor.

FIG. 3 is a top-down view of one example of an inverter 200 created with the crossed fin and common gate structure (104, 108 and 110) of FIG. 2, with one end of each of the crossed fins (112 and 114) electrically coupled together, for example, via silicide or contact metal above the source/drain, not shown here for simplicity, in accordance with one or more aspects of the present invention.

Note that the crossed fins need not be of the same width, but, as shown in FIG. 3, may be different widths. In one example, fin 108 (the vertical fin) is n-type and fin 104 (the horizontal fin) is p-type, with fin 108 tied to Vss and fin 104 tied to Vcc (e.g., through contact metals, not shown here for simplicity). If the voltage applied at common gate 110 is high (Vcc) (e.g., via a contact above gate 106, not shown here), then the fins underneath the gate (i.e., the channel) become n-type (electrons), though fin 104 outside the gate retains a high concentration of p-type impurities (holes), with one end of fin 104 outside gate 106 connected to Vcc, and the output voltage 115 is low (Vss) and vice-versa. Thus, the common gate acts as the input node to the inverter. Note that the inverter can be formed on either bulk semiconductor or silicon-on-insulator (SOI) substrates.

FIG. 4 is an alternate example of an inverter 300 similar to that of FIG. 3, but with two crossed fins (108 and 116) in the y-direction, rather than one, in accordance with one or more aspects of the present invention. In one example, fins 108 and 116 are n-type, while fin 104 is p-type. The operation of inverter 300 is similar to that of inverter 200 in FIG. 2. In general, the inverter can include multiple fins for one or both of n-type and p-type fins.

Figure 5:
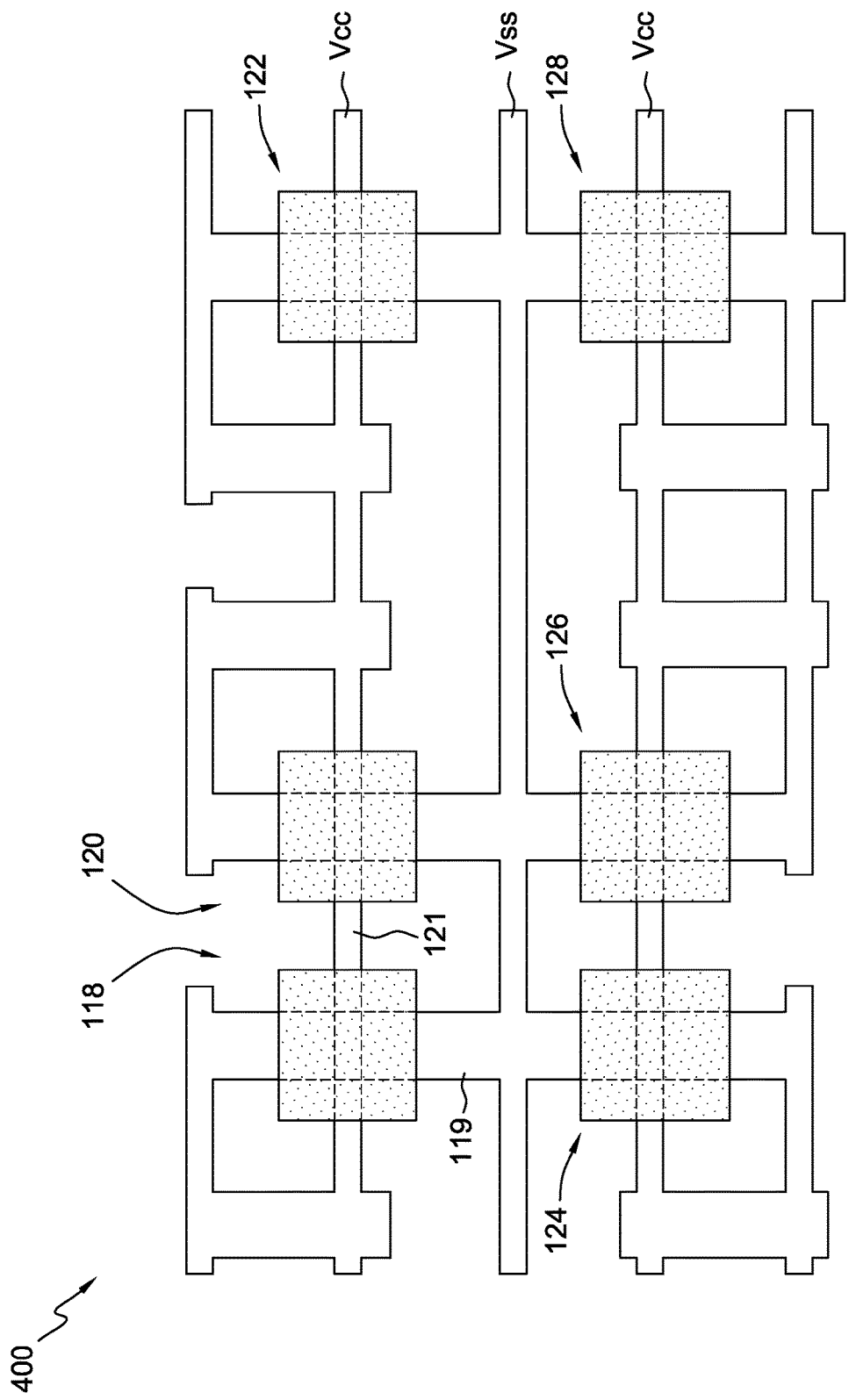
FIG. 5 is a top-down view of one example of an inverter array using multiples of the inverter of FIG. 3 electrically coupled together, in accordance with one or more aspects of the present invention.

FIG. 5 is a top-down view of one example of an inverter array 400 including multiple inverters (118, 120, 122, 124, 126 and 128) of the type of FIG. 3 electrically coupled together, in accordance with one or more aspects of the present invention. FIG. 3 also illustrates portions of the fins, intentionally cut for electrical isolation between devices using, for example, a "CUT" mask during formation of the fins.

In one example, as shown in FIG. 5, the inverter array can be formed on a grid of fins in the X and Y directions. Note that the fin width and pitch of fins can be different in the X and Y directions. In one example, using inverter 118, which may be replicated throughout the array, fin 119 (vertical or Y-direction fins) may be n-type and fin 121 (horizontal or X-direction fins) may be p-type, with fin 119 tied to Vss and fin 121 tied to Vcc. Note that the inverter array can be connected into logic circuits using additional contacts and metal interconnections at BEOL (the Back End of the Process Line—not shown here) as known to those skilled in the art.

FIG. 6 is a top-down view of one example of a non-planar semiconductor structure 500, including both long-channel 130 and short-channel 132 (similar to conventional) semiconductor devices based on the crossed-fin structure, in accordance with one or more aspects of the present invention.

As shown in FIG. 6, a long-channel device 130 is illustrated in the X direction with a fin pitch that is equal to four Y-direction fins combined, while a short-channel device 132 is illustrated in the Y direction and is on a single Y-direction fin. Long-channel device 130 includes, for example, a source 131 and a drain 133 with common gate 135 covering the intersection (i.e., the channel) of fin 137 and fins 138. In contrast, short-channel device 132 includes on a single fin 139, a source 140, a drain 141, a gate 142, the channel portion of fin 139 being underneath the gate 142 between the source and drain. Note that, although not shown for simplicity, the long and short-channel devices are electrically isolated from each other by, for example, using a "cut" mask to remove those fins undesirably connected to the adjacent devices (as illustrated in FIG. 5). Thus, conventional long or short channel MOSFETs can also be formed by the crossed-fins array and common gate structures.

FIG. 7 is a top-down view of another example of a non-planar semiconductor structure 600, including p-type long-channel devices (e.g., long-channel device 134) based on the crossed-fin structure, and n-type short-channel devices (e.g., short-channel device 136) adjacent the long-channel devices, in accordance with one or more aspects of the present invention.

P-type long-channel device 134 includes, for example, a source 143, a drain 144 on fin 145 in the X direction (assuming p-type for all X direction fins), and a common gate 147 covering an intersection of the X direction fin and multiple (in this case, four) fins 149 in the Y direction. N-type short-channel device 136 includes, for example, on Y-direction fin 150 (assuming n-type for all Y direction fins), a source 151, a drain 152 and a gate 153. Note that long-channel device 134 can be modulated with a voltage bias on short-channel device 136, providing different threshold voltages for the long-channel devices.

Figure 8:
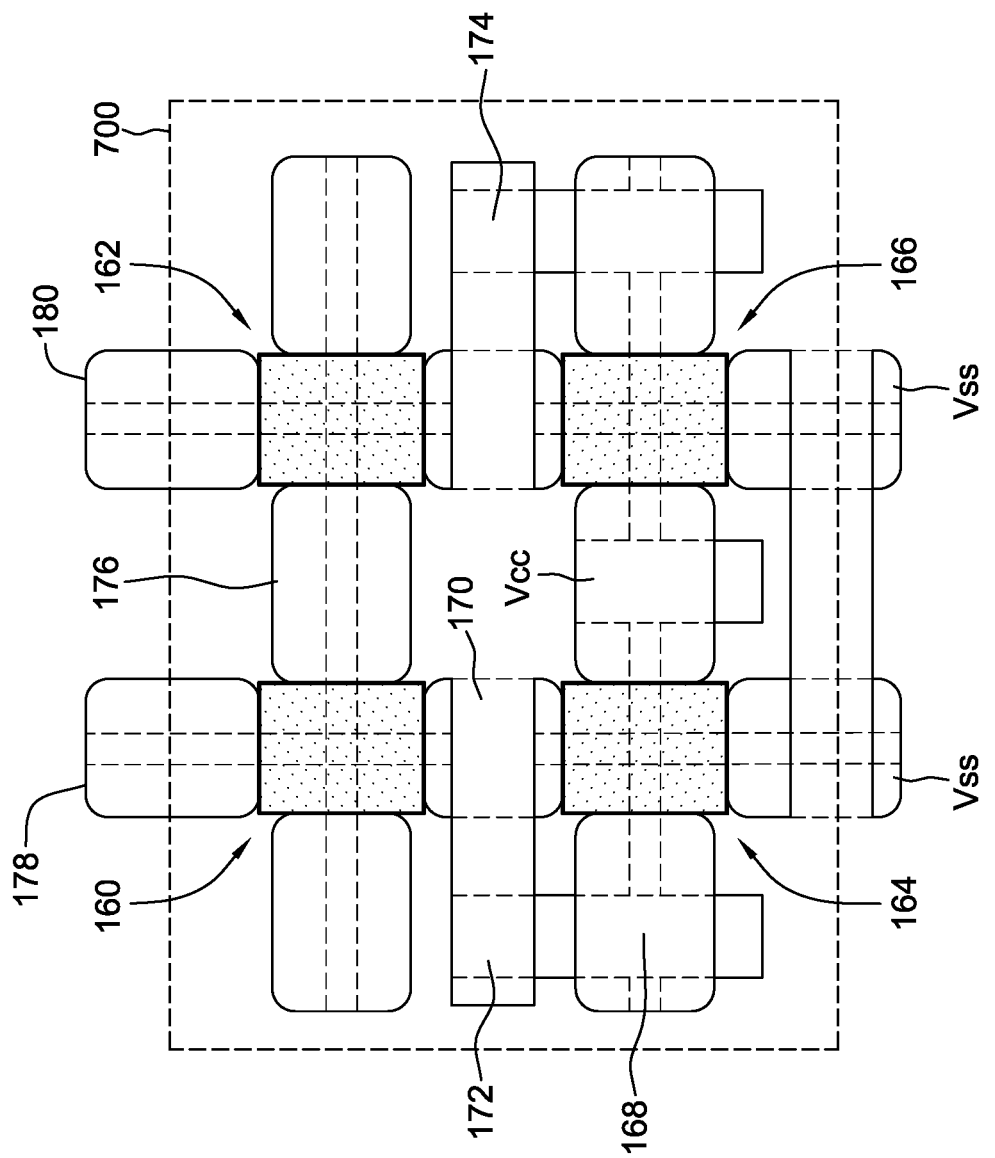
FIG. 8 is a top-down view of one example of a semiconductor SRAM cell based on the crossed-fin structure, resulting in a smaller cell requiring only four merged transistors (versus a conventional SRAM cell, which requires six conventional transistors), with two of the merged transistors acting as inverters, in accordance with one or more aspects of the present invention.

FIG. 8 is a top-down view of one example of a semiconductor SRAM cell 700 based on the crossed-fin structure (not to be confused with inverter array 400 in FIG. 5), resulting in a smaller cell requiring only four merged transistors 160, 162, 164 and 166 (versus a conventional SRAM cell, which requires six conventional transistors), with two of the merged transistors acting as inverters (142 and 144), and the other two (160 and 162) acting as the pass transistor, in accordance with one or more aspects of the present invention.

Devices 160 and 162 are merged transistors (no electrically coupled fin ends) that may be used, for example, as n-type pass transistors (i.e., the p-type fin portion outside the common gate is unused and left floating with no electrical connection), while devices 164 and 166 are inverters, due to electrically coupled fin ends, for example, fin ends 168 and 170. In one example, a SRAM function is achieved when the Y-direction fins (n-type) are tied to Vss (ground) through contacts and metal, while the common node between the inverters (X direction p-type fins) is tied to Vcc. Voltage outputs of the inverters 172 and 174 will be low and high, respectively, and are connected to pass transistors 160 and 162 and cross coupled to the gate of 166 and 164, respectively, through contact/metal (not shown here). The write line 176 is to turn on both the pass transistors 160 and 162. The output of 160 and 162 are shown as 178 and 180, respectively.

FIG. 9 is a top-down view of one example of a non-planar semiconductor structure 800 with two sets of non-planar semiconductor structures or fins (146 and 148) prior to the creation of additional fins for the crossed-fin structure, the structures oriented differently from each other, in this case oriented about 90° different, in accordance with one or more aspects of the present invention. Optionally, one of the sets of fins could be used to fabricate conventional FinFETs, while the other set is used for the cross-fin structure. Furthermore, if the polarity of doping of the X-direction fins and Y-direction fins is reversed (with respect to FIGS. 3, 4 and 7), the cross-fin inverters and long/short transistors are also functional with the proper change of polarity (e.g. the p-type horizontal transistor becomes a n-type transistor, and vice versa) and certainly with proper connection to voltage bias (e.g. reversing Vss and Vcc).

FIG. 10 is a high-level flow diagram 900 of one example of a conventional process of FinFET fabrication on the left (using a gate last process) and additional steps on the right; the combination of which implement the crossed-fin structure and create a merged transistor, in accordance with one or more aspects of the present invention. All individual aspects of the flow can be performed using, for example, conventional processes and techniques.

The fabrication flow begins with forming crossed fins on the substrate (FIG. 10, 200). See, generally, FIG. 1. In one example, a first mask is used to etch one of the fins of a cross-fin pair, with the second fin created using, for example, a second mask or, as another example, by rotating the wafer 90° (FIG. 10, 202). In either case, the requisite wells (n and/or p) are then formed (FIG. 10, 204). Dummy gate formation (FIG. 10, 206) is next, taking the form of common dummy gate formation (FIG. 10, 208); that is, a dummy gate common to both cross fins. See, generally, FIG. 2. The source and drain may then be formed (FIG. 10, 210), first in one direction and then the other (FIG. 10, 212). See, for example, the long-channel device of FIG. 6. After source/drain formation, the dummy gate is replaced with a conductive gate (FIG. 10, 214), which in this case takes the form of a replacement common conductive gate (FIG. 10, 216). After replacing the common dummy gate with a conductive one, the channel may be formed for one of the cross fins, then the other; in this case, forming epitaxial semiconductor material in the channel of one fin, then the other (FIG. 10, 218). At this point, contacts to the devices may be formed (FIG. 10, 220), and the fabrication continues with the typical back-end-of-the-line processing (FIG. 10, 222).

In a first aspect, disclosed above is a semiconductor structure. The structure includes a semiconductor substrate, one or more elongated regions (e.g., fin(s) in a non-planar structure) of one of p-type and n-type, one or more other elongated regions of the other of p-type and n-type, a common area including an intersection of the elongated regions, and a shared gate structure over each common area.

In one example, the elongated regions may be situated, for example, in the substrate, i.e., a planar structure.

In one example, the semiconductor structure of the first aspect may further include, for example, multiple raised semiconductor structures coupled to the substrate, and each of the elongated region(s) and the other elongated region(s) may be situated in a different raised structure. In one example, the elongated region(s) of the semiconductor structure of the first aspect may have, for example, a different width than the other elongated region(s).

In one example, the common area(s) of the starting structure of the first aspect may include, for example, more of one elongated region than the other elongated region.

In one example, the added impurities level of corresponding elongated regions in the semiconductor structure of the first aspect may be, for example, less in the common area than outside the common area. In one example, the common area(s) may have, for example, an absence of added impurities.

In one example, the shared gate of the starting structure of the first aspect may include, for example, a dummy gate.

In one example, the shared gate of the starting structure of the first aspect may include, for example, a conductive gate. In one example, the conductive gate of the starting structure of the first aspect may include, for example, a single mid-gap work function material, for example, titanium carbide (TiC).

In one example, the elongated region(s) of the starting structure of the first aspect may include, for example, one elongated region, the other elongated region(s) including one other elongated region, one end of the elongated region(s) and one end of the other elongated region(s) outside the common area may be, for example, electrically shorted, and the structure acts as an inverter. Such inverters are suitable for low voltage (e.g., Vcc<0.8 v) applications, and, where the channel is fully depleted, low power applications.

In one example, the semiconductor structure may include, for example, an array of the inverters, which may, for example, be connected into logic circuits.

In one example, the elongated region(s) and the other elongated region(s) of the starting structure of the first aspect may include, for example, epitaxial semiconductor material.

In one example, the semiconductor structure of the first aspect may include, for example, a long-channel transistor, and a channel in the elongated region(s) spans at least two of the other (crossing) elongated region(s).

In one example, the semiconductor structure including the long-channel transistor may further include, for example, a short-channel transistor along one of the other elongated region(s) outside the common area. In another example, the semiconductor structure including the long-channel transistor may further include, for example, a short-channel transistor along one of the other elongated region(s) inside the common area.

In one example, the elongated region(s) of the starting structure of the first aspect may include, for example, two elongated regions, the other elongated region(s) may include, for example, two other elongated regions, each elongated region intersecting both of the other elongated regions, and each of the other elongated regions intersecting both of the elongated regions, four common areas being created from the intersections, the structure acting as a SRAM cell.

In one example, the semiconductor structure of the first aspect may include, for example, multiple separate such structures, each of the separate structures having a different threshold voltage.

In a second aspect, disclosed above is a method. The method includes providing a semiconductor substrate, creating one or more elongated regions of n-type or p-type, and creating at least one other elongated region of the other of n-type or p-type, such that the elongated regions intersect at a common area.

In one example, the method may further include, for example, creating a common gate over the common area.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor structure, comprising:
a semiconductor substrate;
at least one elongated region of one of p-type and n-type;
at least two other elongated regions, wherein the at least two other elongated regions are an opposite type to the at least one elongated region of one of p-type and n-type;
at least one common area comprising an intersection of the at least one elongated region and the at least two other elongated regions; and
a shared gate structure over the at least one common area, wherein the semiconductor structure is configured to act as an inverter;
wherein an added impurities level of the at least one elongated region and the at least two other elongated regions is less in the at least one common area than outside the at least one common area.

2. The semiconductor structure of claim 1, wherein the at least one elongated region and the at least two other elongated regions are situated in the substrate.

3. The semiconductor structure of claim 1, further comprising a plurality of semiconductor fins coupled to the substrate, wherein the at least one elongated region and the at least two other elongated regions are situated in a different fin of the plurality of fins.

4. The semiconductor structure of claim 1, wherein the at least one elongated region has a different width than the at least two other elongated regions.

5. The semiconductor structure of claim 1, wherein the shared gate structure comprises a dummy gate structure.

6. The semiconductor structure of claim 1, wherein the shared gate structure comprises a conductive gate structure.

7. The semiconductor structure of claim 6, wherein the conductive gate structure comprises a single mid-gap work function material.

8. The semiconductor structure of claim 1, wherein the at least one elongated region comprises one elongated region, wherein the at least two other elongated regions comprise two other elongated regions, and wherein one end of the elongated region and corresponding ends of the two other elongated regions outside the common area are electrically shorted.

9. The semiconductor structure of claim 8, comprising an array of the semiconductor structures.

10. The semiconductor structure of claim 1, wherein the at least one elongated region and the at least two other elongated regions comprise epitaxial semiconductor material.

* * * * *